United States Patent [19]  
Ostrogorsky

[11] Patent Number: 4,824,519
[45] Date of Patent: Apr. 25, 1989

[54] METHOD AND APPARATUS FOR SINGLE CRYSTAL PULLING DOWNWARDLY FROM THE LOWER SURFACE OF A FLOATING MELT

[75] Inventor: Aleksandar G. Ostrogorsky, New York, N.Y.

[73] Assignee: Massachusetts Institute of Technology, Cambridge, Mass.

[21] Appl. No.: 112,499

[22] Filed: Oct. 22, 1987

[51] Int. Cl.$^4$ .................. C30B 15/08; C30B 35/00
[52] U.S. Cl. .................. 156/617.1; 156/DIG. 96; 422/249
[58] Field of Search .................. 156/607, 608, 617.1, 156/618.1, 620.2–620.5, DIG. 96; 422/249

[56] References Cited

U.S. PATENT DOCUMENTS

| | | | |
|---|---|---|---|
| 2,872,299 | 2/1959 | Celmer et al. | 156/607 |
| 2,890,139 | 6/1959 | Shockley | 422/249 |
| 3,279,896 | 10/1966 | Hamilton et al. | 422/249 |
| 3,393,054 | 7/1968 | Rupprecht et al. | 422/245 |
| 3,899,304 | 8/1972 | Linares | 156/607 |
| 4,356,152 | 10/1982 | Berkman et al. | 422/249 |
| 4,461,671 | 7/1984 | Seifert et al. | 156/607 |
| 4,650,540 | 3/1987 | Stoll | 422/249 |

FOREIGN PATENT DOCUMENTS 0138279 10/1979 Fed. Rep. of Germany ... 156/DIG. 96

OTHER PUBLICATIONS

Pamplin, B. "Crystal Growth", Second Ed., vol. 16 (1980) pp. 172–174, 357–359.

Primary Examiner—John Doll
Assistant Examiner—R. Bruce Breneman

[57] ABSTRACT

An elemental or compound melt is floated on a denser encapsulent. The melt has two horizontal free surfaces (i.e., surfaces not in contact with a solid). A shaft including a seed crystal extends upwardly through the encapsulent to contact the lower free surface of the melt and then is withdrawn downwardly through the encapsulent to grow the crystal. During solidification mechanical stresses are not imposed on the crystal. The melt is heated from above so that the lower melt surface is colder than the upper melt surface which provides a strong stabilizing temperature gradient within the melt. Unsteady natural convective flows in the melt are eliminated. Steady natural convection is substantially decreased compared to the Czochralski process (CZ) and Liquid Encapsulated Czochralski process (LEC). The stoichiometric ratio in the melt is maintained by controlling the pressure of the volatile element over the upper free surface of the melt.

33 Claims, 1 Drawing Sheet

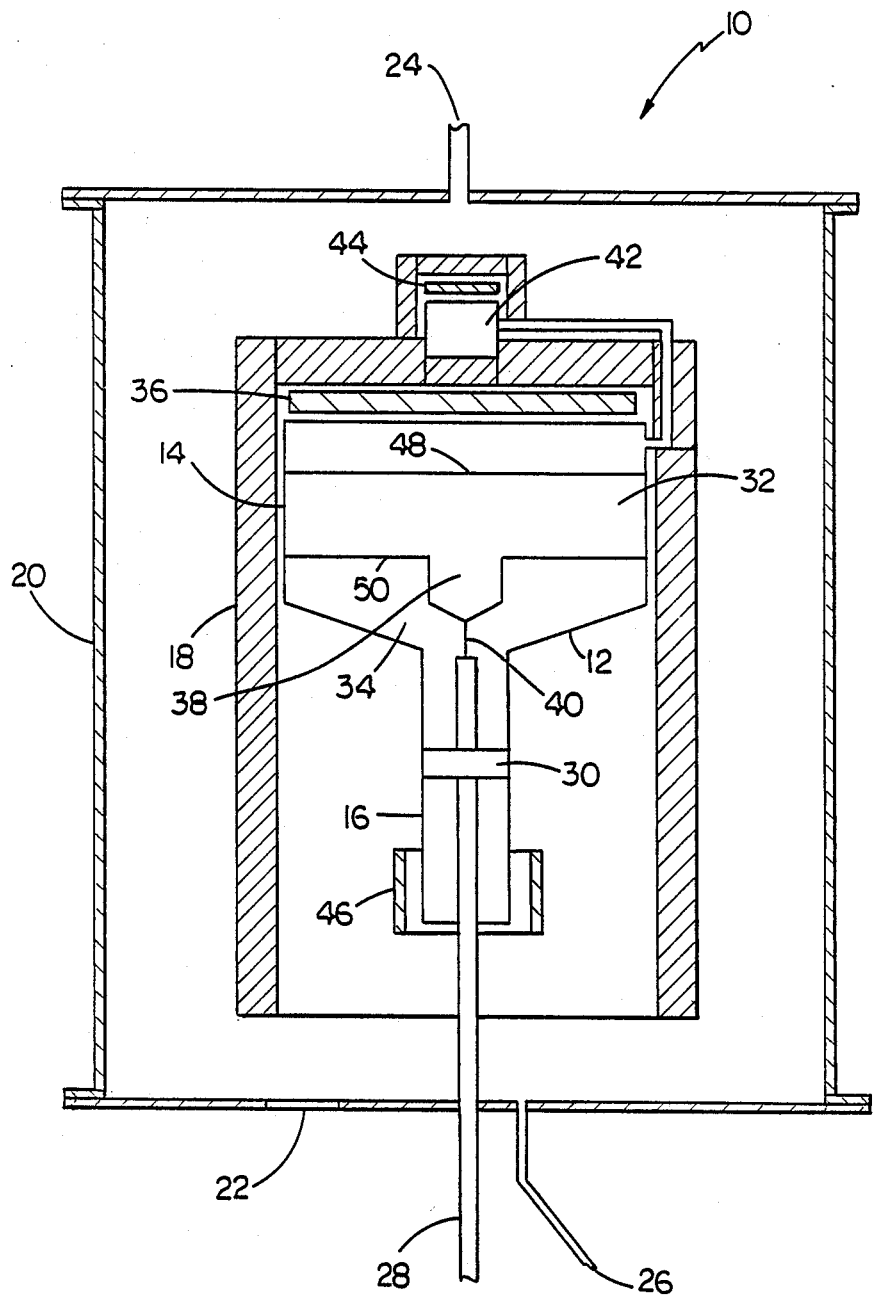

METHOD AND APPARATUS FOR SINGLE CRYSTAL PULLING DOWNWARDLY FROM THE LOWER SURFACE OF A FLOATING MELT

BACKGROUND OF THE INVENTION

The Government has rights in this invention pursuant to Contract Number F33615-83-C-5089 and Grant Number NSG-7645 awarded by the Department of the Air Force and The National Aeronautics and Space Administration.

This invention relates to single crystal growth from a melt.

It is common to grow crystals from a melt by pulling. Known techniques for crystal pulling are the Czochralski process and the Liquid Encapsulated Czochralski process. In these processes, a seed crystal is contacted to the upper surface of the melt and pulled upwardly to grow a crystal. Crystal quality grown by the Czochralski processes is degraded by convective flows in the melt and axial thermal asymmetry within the hot zone of the crystal rowth apparatus. Oftentimes, the melt container and crystal are rotated during crystal growth to ameliorate the effects of the thermal asymmetry and optimize the heat and mass transfer in the melt

SUMMARY OF THE INVENTION

The method for growing a single crystal from a melt according to the invention includes floatin the melt on a liquid encapsulent whose density is greater than the density of the melt. The crystal is pulled downwardly through the encapsulent during the rowth process. The apparatus includes a container for holdin the melt which floats on the denser liquid encapsulent. A pulling shaft includin a seed crystal extends upwardly throuh the encapsulent to contact the melt. The shaft is then withdrawn downwardly, without or with rotation, to grow the crystal. The melt is heated from above to provide stabilizing temperature gradients. The container holding the melt and encapsulent may be pressurized to prevent evaporation of a volatile component of a compound.

BRIEF DESCRIPTION OF THE DRAWING

The single FIGURE of the drawing is a cross-sectional view of the apparatus for growing a single crystal.

DESCRIPTION OF THE PREFERRED EMBODIMENT

With reference to the FIGURE, an apparatus 10 for growing a single crystal includes a container 12 having an upper cylindrical portion 14 and a lower cylindrical section, or neck, 16. The diameter of the neck is somewhat larger than the diameter of the crystal to be grown. The container 12 is preferably made of guartz or pyrolytic boron nitride, PBN. The container 12 is radially insulated with graphite foils and graphite felt 18. The container 12 is mounted within a tank 20 which is preferably water jacketed and made of stainless steel. The tank 20 includes a quartz viewing window 22, an inert gas inlet 24, and a vacuum line 26. Feedthroughs are also provided for electrical power (not shown) and for pulling shaft 28 made of metal or quartz. The shaft 28 includes a plug portion 30 for sealing the container 12. The plug 30 may be made of metal or quartz.

In operation, a polycrystalline charge 32 is loaded into the container 12 from the bottom through the neck portion 16. Next, an encapsulent 34 having a density higher than that of the charge or melt 32 is loaded into the container 12 through the neck portion 16 and sealed with the plug 30. A suitable encapsulent is $Bi_2O_3$. A heater 36 heats the top surface of the melt 32. Heat is extracted from the bottom surface of the melt 32 through the crystal and the encapsulant.

To grow a crystal such as a crystal 38, a seed crystal 40, held at the end of the pulling shaft 28 is raised through the encapsulent 34 until it touches the bottom surface of the melt 32. The shaft 28 is then slowly extracted downwardly to grow the neck, shoulders, body, and tail of the crystal 38 in a fashion similar to Czochralski crystal pullers.

The apparatus 10 is designed for growing elemental crystals such as of silicon, and also for growing Group III-V or Group II-VI compound crystals. The III-V Group compounds are formed by combining elements from Group III with elements from Group V. The II-VI Group compounds are formed by combining elements from Group II with elements of Group VI. Elements from Group V and VI have much higher vapor pressures at a given temperature than the elements of Group II or III and tend to evaporate from the melt. Gallium arsenide, GaAs, is formed from Ga (element of Group III) and As (element of Group V). At the melting point of GaAs (1240° C.), As has a 0.976 atmosphere vapor pressure over the melt. Unless equal pressure is maintained over the melt, the melt will become Ga rich as it loses As. In adition, As condenses on surfaces having temperatures lower than 613° C. Therefore the stoichiometry of the melt cannot be controlled in a cold wall chamber. The apparatus of the invention provides for controlling the partial pressure of the volatile component over the melt in the hot wall container 12. Partial pressure is controlled by an injection cell 42 which contains the volatile component such as As. The temperature and the partial pressure in the injection cell 42 is maintained at a desired level by a heater 44. To minimize mechanical stresses on the container 12 because of vapor pressure controlled by the injection cell 42, an equivalent pressure is provided outside the container by an inert gas introduced into the tank 20 through the gas inlet 24. Yet another heater 46 surrounds the neck portion 16 of the container 12 to prevent freezing of the encapsulent 34.

Because the melt 32 floats on top of the encapsulent 34, the melt 32 has two horizontal free surfaces, i.e., surfaces not in contact with a solid. These two free surfaces are a top free surface 48 and a bottom free surface 50 which is the interface between the melt 32 and the encapsulent 34. Because the growth takes place at the melt-encapsulent interface, mechanical stresses are not imposed on the crystal during solidification which is an advantage compared with the Bridgman process.

Because the melt is heated from the top, it is exposed to a stabilizing temperature gradient since the bottom melt surface 50 is colder than the top melt surface 48. The strong stabilizing temperature gradient eliminates the unsteady (time dependent) natural convection in the melt which exist in the Czochralski process and in the liquid encapsulated Czochralski process. Some very low levels of steady natural convection may still exist in the melt 32 because of radial temperature non uniformity. There may also be low levels of steady natural convection in the encapsulent 34 generated by radial temperature gradients caused by the difference in thermal conductivity of the melt 32 and the encapsulent 34. The invention also results in low thermocapillary (Marangoni) convection. Marangoni flows (i.e., flows driven by surface tension) are minimized by the presence of the viscous encapsulent and by the low radial temperature gradients at the melt/encapsulent interface. Because the apparatus utilizes a hot wall container, vapor pressure of the volatile constituent over the melt, and hence the stoichiometry of the melt is readily controlled during compound crystal growth. Besides carrying the melt, the heavy encapsulent serves to thermally insulate the crystal as it grows reducing thermal stresses and thereby reduces the number of stress induced dislocations. Because of the expected high thermal symmetry, the apparatus of the invention can grow crystals without the need for rotating the crucible or the crystal. However, in some applications, crystal rotation might optimize the fluid flow and mass transfer in the melt. High axial thermal symmetry is achieved since heat is supplied from the top rather than radially. The insulation 18 also results in high symmetry in heat losses from the container 12.

It is recognized that modifications and variations of the invention will be apparent to those skilled in the art and it is intended that all such modifications and variations be included within the scope of the appended claims.

What is claimed is:

1. Apparatus for growing a single crystal from a melt comprising:
    a container for holding a melt
    a liquid encapsulant denser than the melt disposed within the container below the melt; and
    a pulling shaft including a seed crystal extending upwardly through the encapsulant to contact the melt, the shaft adapted to be withdrawn downwardly with or without rotation to grow the crystal inside the liquid encapsulant within the container.

2. Apparatus of claim 1 further including a heater located to heat the top of the melt.

3. Apparatus of claim 1 further including pressure generating apparatus adapted to pressurize the melt.

4. Apparatus of claim 3 wherein the pressure generating apparatus includes an injection cell.

5. Apparatus of claim 4 wherein the injection cell is separately heated.

6. Apparatus of claim 1 further including a tank surrounding the container.

7. Apparatus of claim 6 wherein the tank is water-jacketed.

8. Apparatus of claim 6 further including pressure generating apparatus to pressurize the region between the tank and the container.

9. Apparatus of claim 6 wherein the container includes insulation on its outer surface.

10. Apparatus of claim 6 wherein the tank includes a viewing window.

11. Apparatus of claim 10 wherein the viewing window is quartz.

12. Apparatus of claim 1 wherein the liquid encapsulent is $Bi_2O_3$.

13. Apparatus of claim 1 wherein the crystal is Si.

14. Apparatus of claim 1 wherein the crystal is a compound of a Group III or II element combined with a Group V or VI element.

15. Apparatus of claim 1 wherein the crystal is GaAs.

16. Apparatus of claim 1 wherein the container includes an upper cylindrical portion and a lower neck portion, the neck portion having a smaller diameter than the upper portion.

17. Apparatus of claim 1 wherein the container is quartz.

18. Apparatus of claim 8 wherein the container or the upper portion of the container is pyrolytic boron nitride.

19. Apparatus of claim 9 wherein the insulation is graphite foil.

20. Apparatus of claim 9 wherein the insulation is graphite felt.

21. Apparatus of claim 16 further including a heater surrounding a portion of the neck portion.

22. Apparatus of claim 1 wherein the pulling shaft is quartz.

23. Apparatus of claim 1 wherein the pulling shaft is metal.

24. Apparatus of claim 6 wherein the tank is stainless steel.

25. Method for growing a single crystal from a melt comprising:
    floating the melt on a liquid encapsulent whose density is greater than the density of the melt; and
    pulling the crystal downwardly through the encapsulent without or with rotation.

26. Method of claim 25 wherein the melt is heated from above.

27. Method of claim 25 wherein a seed crystal is contacted to the melt to initiate the pulling.

28. Method of claim 25 wherein the crystal is a compound including a volatile component and further including pressurizing the melt with the vapor of the volatile component to prevent its evaporation.

29. Method of claim 25 wherein the crystal is Si.

30. Method of claim 25 or claim 28 wherein the crystal is a compound of a Group III or II element combined with a Group V or VI element.

31. Method of claim 25 or claim 28 wherein the crystal is GaAs.

32. Method of claim 25 or claim 28 wherein the encapsulent is $Bi_2O_3$.

33. The apparatus of claim 1 further including apparatus for rotating the crystal during crystal growth.

* * * * *

UNITED STATES PATENT AND TRADEMARK OFFICE
CERTIFICATE OF CORRECTION

PATENT NO. : 4,824,519

DATED : April 25, 1989

INVENTOR(S) : Aleksandar G. Ostrogorsky

It is certified that error appears in the above-identified patent and that said Letters Patent is hereby corrected as shown below:

Column 1, line 22, change "rowth" to --growth--;
         line 28, change "floatin" to --floating--;
         line 32, change "rowth" to --growth--;
         line 33, change "holdin" to --holding--;
         line 35, change "includin" to --including--;
         line 35, change "throuh" to --through--;
         line 56, change "guartz" to --quartz--.

Column 2, line 66, change "non unifor-" to --non-unifor---.

Signed and Sealed this

Sixteenth Day of January, 1990

Attest:

JEFFREY M. SAMUELS

Attesting Officer        Acting Commissioner of Patents and Trademarks